(12) United States Patent
Chiu et al.

(10) Patent No.: US 11,116,113 B2
(45) Date of Patent: Sep. 7, 2021

(54) COOLING ELECTRONIC DEVICES IN A DATA CENTER

(71) Applicant: Google LLC, Mountain View, CA (US)

(72) Inventors: Jerry Chiu, Pacifica, CA (US);
Abolfazl Sadeghpour, Los Angeles, CA (US); Gregory P. Imwalle, Mountain View, CA (US)

(73) Assignee: Google LLC, Mountain View, CA (US)

( * ) Notice: Subject to any disclaimer, the term of this patent is extended or adjusted under 35 U.S.C. 154(b) by 230 days.

(21) Appl. No.: 16/424,135

(22) Filed: May 28, 2019

(65) Prior Publication Data
US 2020/0323100 A1 Oct. 8, 2020

Related U.S. Application Data

(60) Provisional application No. 62/830,927, filed on Apr. 8, 2019.

(51) Int. Cl.
*H05K 7/20* (2006.01)

(52) U.S. Cl.
CPC .............. *H05K 7/208* (2013.01); *H05K 7/203* (2013.01); *H05K 7/2039* (2013.01);
(Continued)

(58) Field of Classification Search
CPC .............. H05K 7/20236; H05K 7/203; H05K 7/20272; H05K 7/20818; H05K 7/20327;
(Continued)

(56) References Cited

U.S. PATENT DOCUMENTS 3,406,244 A * 10/1968 Oktay ................ H01J 7/24
174/15.1
4,027,728 A 6/1977 Kobayashi et al.
(Continued)

FOREIGN PATENT DOCUMENTS

| CN | 101075592 | 11/2007 |
|---|---|---|
| EP | 3279764 | 2/2018 |
| EP | 3422835 | 1/2019 |

OTHER PUBLICATIONS

PCT International Search Report and Written Opinion in International Application No. PCT/US2019/063371, dated Feb. 27, 2020, 17 pages.
(Continued)

*Primary Examiner* — Stephen S Sul
*Assistant Examiner* — Michael A Matey
(74) *Attorney, Agent, or Firm* — Fish & Richardson P.C.

(57) ABSTRACT

A data center cooling system includes an outer container that defines a first volume; an inner container that defines a second volume and is positioned within the first volume, the inner container including an air outlet that includes an airflow path between the first and second volumes; a liquid seal to fluidly isolate a liquid phase of a non-conductive coolant that fills at least a portion of the first and second volumes from an ambient environment; and at least one server tray assembly. The server tray assembly includes a plurality of electronic heat-generating devices immersed in the liquid phase of the non-conductive coolant; and an immersion cooling system mounted to and in conductive thermal contact with one or more of the plurality of electronic heat-generating devices. The immersion cooling system includes a working fluid in thermal communication with the one or more electronic heat-generating devices and the non-conductive coolant.

37 Claims, 6 Drawing Sheets

(52) U.S. Cl.
CPC ..... *H05K 7/20318* (2013.01); *H05K 7/20336* (2013.01); *H05K 7/20363* (2013.01)

(58) Field of Classification Search
CPC .......... H05K 7/20318; H05K 7/20772; H05K 7/20809; H05K 7/20781; H05K 7/20763; H05K 7/208; H05K 7/20736; H05K 7/20218; H05K 7/2029; H05K 7/20309; H05K 7/20336; H05K 7/2039; H05K 7/20881; H05K 7/20927; H05K 1/0203; H05K 7/20663; H05K 7/20363
See application file for complete search history.

(56) References Cited

U.S. PATENT DOCUMENTS

| | | | |
|---|---|---|---|
| 4,399,484 A | 8/1983 | Mayer | |
| 5,216,580 A * | 6/1993 | Davidson | F28D 15/0266 361/700 |
| 5,604,978 A | 2/1997 | Sherif | |
| 6,366,462 B1 | 4/2002 | Chu | |
| 6,889,509 B1 * | 5/2005 | Cader | G01R 31/2874 62/118 |
| 8,351,206 B2 * | 1/2013 | Campbell | H05K 7/20809 361/700 |
| 8,619,425 B2 * | 12/2013 | Campbell | H05K 7/203 361/699 |
| 9,596,787 B1 * | 3/2017 | Iyengar | H05K 7/20318 |
| 10,130,013 B1 | 11/2018 | Iyengar et al. | |
| 2005/0082037 A1 | 4/2005 | Thayer et al. | |
| 2006/0059940 A1 * | 3/2006 | Hess | F25D 31/002 62/389 |
| 2006/0196640 A1 * | 9/2006 | Siu | H01L 23/433 165/104.26 |
| 2008/0123297 A1 | 5/2008 | Tilton | |
| 2010/0073872 A1 | 3/2010 | Pakravan | |
| 2010/0101759 A1 | 4/2010 | Campbell et al. | |
| 2010/0263885 A1 | 10/2010 | Tuma | |
| 2011/0132579 A1 * | 6/2011 | Best | H05K 7/20772 165/104.31 |
| 2014/0124174 A1 * | 5/2014 | Campbell | F28F 3/048 165/104.31 |
| 2014/0216686 A1 * | 8/2014 | Shelnutt | H05K 7/20827 165/67 |
| 2014/0216688 A1 | 8/2014 | Shelnutt et al. | |
| 2014/0218858 A1 | 8/2014 | Shelnutt et al. | |
| 2014/0218859 A1 | 8/2014 | Shelnutt et al. | |
| 2014/0218861 A1 * | 8/2014 | Shelnutt | H05K 7/20809 361/679.53 |
| 2014/0307384 A1 * | 10/2014 | Best | H05K 7/1497 361/679.53 |
| 2014/0355218 A1 | 12/2014 | Vinciarelli | |
| 2015/0359128 A1 | 12/2015 | Bailey | |
| 2016/0345461 A1 * | 11/2016 | Smith | H05K 7/20818 |
| 2017/0156233 A1 * | 6/2017 | Moss | H05K 7/20763 |
| 2018/0027695 A1 * | 1/2018 | Wakino | H05K 7/20772 361/699 |
| 2018/0153058 A1 * | 5/2018 | Hirai | H05K 7/20781 |
| 2019/0014688 A1 * | 1/2019 | Weibel | H05K 7/20336 |
| 2019/0219311 A1 * | 7/2019 | Smith | H05K 7/20272 |
| 2019/0223324 A1 * | 7/2019 | Le | H05K 7/20272 |
| 2019/0364693 A1 * | 11/2019 | Nishiyama | H05K 7/20272 |
| 2020/0037469 A1 * | 1/2020 | Tian | H05K 7/20327 |
| 2020/0100396 A1 * | 3/2020 | Iyengar | H05K 7/20509 |
| 2020/0267872 A1 * | 8/2020 | Harada | H05K 7/203 |

OTHER PUBLICATIONS

Rich Miller, "Green Revolution's Immersion Cooling in Action," Data Center Knowledge, Apr. 12, 2011 retrieved from http://www.datacenterknowledge.com/archives/2011/04/12/green-revolutions-immersion-cooling-in-action/, 14 pages.

Rich Miller, "NSA Exploring Use of Mineral Oil to Cool its Servers," Data Center Knowledge, Sep. 4, 2014, retrieved from http://www.datacenterknowledge.com/archives/2014/09/04/nsa-exploring-use-mineral-oil-cool-servers/?utm_source=DailyNewsletter&utm_medium=email&utm_campaign=DailyNewsletterB&utm_content=09-05-2014, 8 pages.

Satish C. Mohapatra, "An Overview of Liquid Coolants for Electronics Cooling," Electronics Cooling, May 2006, retrieved from http://www.electronics-cooling.com/2006/05/an-overview-of-liquid-coolants-for-electronics-cooling/, 5 pages.

Rich Miller, "DataTank: Immersion Containers for Industrial Bitcoin Mining," Data Center Knowledge, Apr. 7, 2014, retrieved from http://www.datacenterknowledge.com/archives/2014/04/07/datatank-immersion-containers-industrial-bitcoin-mining/?utm_source=DailyNewsletter&utm_medium=email&utm_campaign=DailyNewsletterA&utm_content=04-08-2014, 7 pages.

Rich Miller, "New From 3M: Boiling Liquid to Cool Your Servers," Data Center Knowledge, Apr. 9, 2014, retrieved from http://www.datacenterknowledge.com/archives/2014/04/09/new-3m-boiling-liquid-cool-servers/?utm_source=DailyNewsletter&utm_medium=email&utm_campaign=DailyNewsletterA&utm_content=04-10-2014, 7 pages.

Slashdot, "New Approach to Immersion Cooling Powers HPC in a High Rise," Nov. 14, 2013, retrieved from http://beta.slashdot.org/story/194329, 4 pages.

'3m.com [online],' "3Mtm Performance Fluid Pf-5056," May 2019, [retrieved on May 29, 2019], retrieved from: URL<https://www.3m.com/3M/en_US/company-us/all-3m-products/~/3M-Performance-Fluid-PF-5056/?N=5002385+3290667388&preselect=3293786499&rt=rud>, 8 pages.

TW Office Action in Taiwan Application No. 108143637, dated Jan. 20, 2021, 23 pages (with English translation).

* cited by examiner

COOLING ELECTRONIC DEVICES IN A DATA CENTER

CROSS-REFERENCE TO RELATED APPLICATION

This application claims priority under 35 U.S.C. § 119 to U.S. Provisional Patent Application No. 62/830,927, filed on Apr. 8, 2019, the entire contents of which are incorporated by reference herein.

TECHNICAL FIELD

This document relates to systems and methods for providing cooling to electronic equipment, such as computer server racks and related equipment in computer data centers with a non-conductive coolant.

BACKGROUND

Computer users often focus on the speed of computer microprocessors (e.g., megahertz and gigahertz). Many forget that this speed often comes with a cost—higher power consumption. This power consumption also generates heat. That is because, by simple laws of physics, all the power has to go somewhere, and that somewhere is, in the end, conversion into heat. A pair of microprocessors mounted on a single motherboard can draw hundreds of watts or more of power. Multiply that figure by several thousand (or tens of thousands) to account for the many computers in a large data center, and one can readily appreciate the amount of heat that can be generated. The effects of power consumed by the critical load in the data center are often compounded when one incorporates all of the ancillary equipment required to support the critical load.

Many techniques may be used to cool electronic devices (e.g., processors, memories, networking devices, and other heat generating devices) that are located on a server or network rack tray. For instance, forced convection may be created by providing a cooling airflow over the devices. Fans located near the devices, fans located in computer server rooms, and/or fans located in ductwork in fluid communication with the air surrounding the electronic devices, may force the cooling airflow over the tray containing the devices. In some instances, one or more components or devices on a server tray may be located in a difficult-to-cool area of the tray; for example, an area where forced convection is not particularly effective or not available.

The consequence of inadequate and/or insufficient cooling may be the failure of one or more electronic devices on the tray due to a temperature of the device exceeding a maximum rated temperature. While certain redundancies may be built into a computer data center, a server rack, and even individual trays, the failure of devices due to overheating can come at a great cost in terms of speed, efficiency, and expense.

SUMMARY

This disclosure describes a data center cooling system that cools one or more electronic heat-generating devices with a non-conductive coolant and one or more heat transfer devices (e.g., heat pipes, three-dimensional vapor chambers) in thermal contact with the heat-generating devices and immersed in the coolant. For example, the non-conductive coolant may be a dielectric coolant. In some aspects, a non-conductive coolant or dielectric coolant does not conduct an electric charge or conducts a small enough electric charge that operation of any electronic device immersed in such coolant is not affected. Examples of a non-conductive coolant or a dielectric coolant include, for instance, aromatics, silicate-ester, aliphatics, silicones, fluorocarbons, and oils such as mineral oil. In some aspects, the data center cooling system includes one or more inner containers that fluidly isolate the non-conductive coolant from an ambient environment along with an outer container that encloses the inner container.

In an example implementation, a data center cooling system includes an outer container that defines a first volume; an inner container that defines a second volume and is positioned within the first volume, the inner container including an air outlet that includes an airflow path between the first and second volumes; a liquid seal to fluidly isolate a liquid phase of a non-conductive coolant that fills at least a portion of the first and second volumes from an ambient environment; and at least one server tray assembly. The server tray assembly includes a plurality of electronic heat-generating devices immersed in the liquid phase of the non-conductive coolant; and an immersion cooling system mounted to and in conductive thermal contact with one or more of the plurality of electronic heat-generating devices. The immersion cooling system includes a working fluid in thermal communication with the one or more electronic heat-generating devices and the non-conductive coolant.

In an aspect combinable with the example implementation, the immersion cooling system includes a vapor chamber mounted to and in conductive thermal contact with the one or more electronic heat-generating devices; and one or more heat transfer devices positioned in thermal contact with the working fluid within an inner volume of the vapor chamber and in thermal contact with a liquid phase of the non-conductive coolant.

In another aspect combinable with any one of the previous aspects, each of the one or more heat transfer devices includes a condenser tube.

In another aspect combinable with any one of the previous aspects, the condenser tube includes an inlet open to the inner volume to receive a vapor phase of the working fluid from the inner volume; an outlet open to the inner volume to circulate a liquid phase of the working fluid to the inner volume; and a u-shaped flowpath between the inlet and the outlet that extends from the inner volume, through a wall of the vapor chamber, and to the second volume.

Another aspect combinable with any one of the previous aspects further includes a wick positioned in at least a portion of the flowpath.

In another aspect combinable with any one of the previous aspects, each of the one or more heat transfer devices includes a heat pipe positioned to extend from the inner volume, through a wall of the vapor chamber, and into the second volume.

In another aspect combinable with any one of the previous aspects, the immersion cooling system further includes a thermal interface material positioned between and in conductive thermal contact with the one or more electronic heat-generating devices and the vapor chamber.

In another aspect combinable with any one of the previous aspects, the immersion cooling system further includes one or more biasing members coupled to the vapor chamber and the server tray assembly and configured to urge the vapor chamber toward the one or more electronic heat-generating devices.

In another aspect combinable with any one of the previous aspects, the outer container includes a pressure relief valve configured to vent a portion of air, vented from the second volume through the air outlet and into the first volume, to the ambient environment; and a base and a chimney that extends vertically from the base, the base including a first portion of the first volume and the chimney includes a second portion of the first volume that is in fluid communication with the first portion.

In another aspect combinable with any one of the previous aspects, the second portion defines a coolant recovery layer that includes a mixture of air and a vapor phase of the non-conductive coolant, a vapor condensing layer that includes substantially the vapor phase of the non-conductive coolant, and a liquid sub-cooling layer that includes substantially the liquid phase of the non-conductive coolant.

Another aspect combinable with any one of the previous aspects further includes a cooling module mounted in the chimney and configured to cool the non-conductive coolant.

In another aspect combinable with any one of the previous aspects, the non-conductive coolant includes a dielectric coolant.

In another example implementation, a method for cooling electronic heat-generating devices in a data center includes enclosing a plurality of server tray assemblies in a volume defined by a first container. Each of the server tray assemblies includes a plurality of electronic heat-generating devices, and an immersion cooling system mounted to and in conductive thermal contact with one or more of the plurality of electronic heat-generating devices. The immersion cooling system includes a working fluid in thermal communication with the one or more electronic heat-generating devices. The method further includes immersing the plurality of server tray assemblies in a liquid phase of a non-conductive coolant; operating the one or more electronic heat-generating devices to generate heat; transferring the generated heat from the one or more electronic heat-generating devices to the working fluid of the immersion cooling system; and transferring the generated heat from the working fluid of the immersion cooling system to the liquid phase of the non-conductive coolant.

An aspect combinable with the example implementation further includes transferring the generated heat to the working fluid contained in an inner volume of a vapor chamber of the immersion cooling system that is mounted to and in conductive thermal contact with the one or more electronic heat-generating devices; vaporizing, with the transferred heat, at least a portion of a liquid phase of the working fluid into a vapor phase of the working fluid; and circulating the vapor phase from the inner volume into one or more condenser tubes positioned in thermal contact with the working fluid within an inner volume of the vapor chamber and in thermal contact with the liquid phase of the non-conductive coolant.

In another aspect combinable with any one of the previous aspects, circulating the vapor phase from the inner volume into one or more condenser tubes includes circulating the vapor phase through an inlet of a particular condenser tube that is open to the inner volume; circulating the vapor phase through a u-shaped flowpath of the particular condenser tube; condensing at least a portion of the vapor phase in the u-shaped flowpath by transferring heat to the liquid phase of the non-conductive coolant; and circulating the condensed portion through an outlet of the particular condenser tube and into the inner volume.

In another aspect combinable with any one of the previous aspects, circulating the vapor phase through the u-shaped flowpath includes circulating the vapor phase based at least partially on wicking the vapor phase through the u-shaped flowpath.

Another aspect combinable with any one of the previous aspects further includes transferring the generated heat to the working fluid contained in an inner volume of a vapor chamber of the immersion cooling system that is mounted to and in conductive thermal contact with the one or more electronic heat-generating devices; vaporizing, with the transferred heat, at least a portion of a liquid phase of the working fluid into a vapor phase of the working fluid; and vaporizing, with heat in the vapor phase of the working fluid, at least a portion of a liquid phase of a refrigerant contained in at least one heat pipe positioned in thermal contact with the working fluid within an inner volume of the vapor chamber and in thermal contact with the liquid phase of the non-conductive coolant.

Another aspect combinable with any one of the previous aspects further includes transferring heat from the vaporized refrigerant to the liquid phase of the non-conductive coolant.

Another aspect combinable with any one of the previous aspects further includes transferring heat from the one or more electronic heat-generating devices through a thermal interface material positioned between and in conductive thermal contact with the one or more electronic heat-generating devices and the vapor chamber.

Another aspect combinable with any one of the previous aspects further includes urging the vapor chamber toward the one or more electronic heat-generating devices with one or more biasing members coupled to the vapor chamber and the server tray assembly.

Another aspect combinable with any one of the previous aspects further includes enclosing the first container in a second volume of a second container, the non-conductive coolant filling at least a portion of the first and second volumes; sealing the liquid phase of the non-conductive coolant from an ambient environment; transferring a heat load from the plurality of electronic heat-generating devices to the liquid phase of the non-conductive coolant; forming an airflow path between the first and second volumes; and venting a portion of air from the first volume, through the airflow path, through the second volume and to the ambient environment.

In another aspect combinable with any one of the previous aspects, the second container includes a base and a chimney that extends vertically from the base, the base including a first portion of the second volume and the chimney includes a second portion of the second volume that is in fluid communication with the first portion.

Another aspect combinable with any one of the previous aspects further includes cooling a mix of air and a first portion of a vapor phase of the non-conductive coolant in a top portion of the chimney to condense the first portion of the vapor phase to the liquid phase of the non-conductive coolant; cooling a second portion of the vapor phase of the non-conductive coolant in a middle portion of the chimney to condense the second portion of the vapor phase to the liquid phase of the non-conductive coolant; and sub-cooling the liquid phase of the non-conductive coolant in a bottom portion of the chimney.

Another aspect combinable with any one of the previous aspects further includes supplying a cooling fluid to a cooling module positioned in the chimney.

In another aspect combinable with any one of the previous aspects, the non-conductive coolant includes a single-phase non-conductive coolant.

Another aspect combinable with any one of the previous aspects further includes circulating a sub-cooled liquid phase of the non-conductive liquid coolant from a bottom portion of the second volume to a top portion of the second volume; and circulating the sub-cooled liquid in the top portion over a cooling module positioned in the second volume.

In another aspect combinable with any one of the previous aspects, the second container includes a human-occupiable housing, and the second volume includes a human-occupiable workspace.

In another aspect combinable with any one of the previous aspects, the non-conductive coolant includes a dielectric coolant.

In an example implementation, a submergible server tray assembly includes a motherboard; at least one hardware processor coupled to the motherboard; and an immersion cooling system mounted to and in conductive thermal contact with the processor. The immersion cooling system including a working fluid in thermal communication with the processor. The motherboard, processor, and immersion cooling system are configured to submerge in a dielectric cooling liquid.

In an aspect combinable with the example implementation, the immersion cooling system includes a housing mounted to and in conductive thermal contact with the processor; and one or more condenser tubes positioned in thermal contact with the working fluid within an inner volume of the housing and extending from the housing, where each of the one or more condenser tubes is configured to submerge in the dielectric cooling liquid.

In another aspect combinable with any one of the previous aspects, the condenser tube includes an inlet open to the inner volume; an outlet open to the inner volume; and a conduit between the inlet and the outlet that extends from the inner volume, through a wall of the housing, and external to the housing.

Another aspect combinable with any one of the previous aspects further includes a wick positioned in at least a portion of the conduit.

Another aspect combinable with any one of the previous aspects further includes a phase change material positioned between and in conductive thermal contact with the processor and the housing.

Various implementations of a data center cooling system according to the present disclosure may include one, some, or all of the following features. For example, the data center cooling system may utilize a dielectric, or non-conductive, liquid coolant to cool one or more electronic heat-generating devices, such as processors, memory modules (e.g., DIMMs or other memory), networking devices, or otherwise. The dielectric, or non-conductive, liquid coolant is a liquid coolant that, in some aspects, retards or prevents electric charges from flowing therethrough, thereby allowing normal operation of the electronic heat-generating devices while immersed in the liquid coolant. As a further example, the data center cooling system may cool more densely packed or positioned electronic heat-generating devices as compared to conventional cooling systems. As another example, the data center cooling system may cool higher power electronic heat-generating devices within a similar space as compared to conventional cooling systems. Further, the data center cooling system may, as compared to conventional dielectric liquid cooling systems, use less dielectric liquid, with a lower cost, to cool the electronic devices. The data center cooling system may also prevent or substantially prevent the escape of liquid or vapor dielectric coolant. As a further example, the data center cooling system may utilize a single phase dielectric, or non-conductive, coolant liquid, thereby substantially preventing vapor bleed-off from the liquid. In another example, the data center cooling system may provide an extended volume to trap a vapor phase of the dielectric liquid coolant and return the vapor phase to a liquid phase. Thus, as compared to conventional liquid coolant systems, implementations described in the present disclosure may use or require substantially less dielectric liquid coolant.

The details of one or more embodiments are set forth in the accompanying drawings and the description below. Other features, objects, and advantages will be apparent from the description and drawings, and from the claims.

DETAILED DESCRIPTION

This document discusses implementations of a data center cooling system that uses a non-conductive, or dielectric, coolant and an immersion cooling system thermally coupled to one or more electronic heat-generating devices to remove heat generated by the devices. The example data center cooling systems may fluidly isolate the non-conductive coolant from an ambient environment in one or multiple containers. The example data center cooling systems may cool the non-conductive coolant with one or more cooling modules contained in the one or multiple containers. In some aspects, the computing devices may be mounted or connected to a structure (e.g., server tray, server board, motherboard, or otherwise).

Figure 1A:
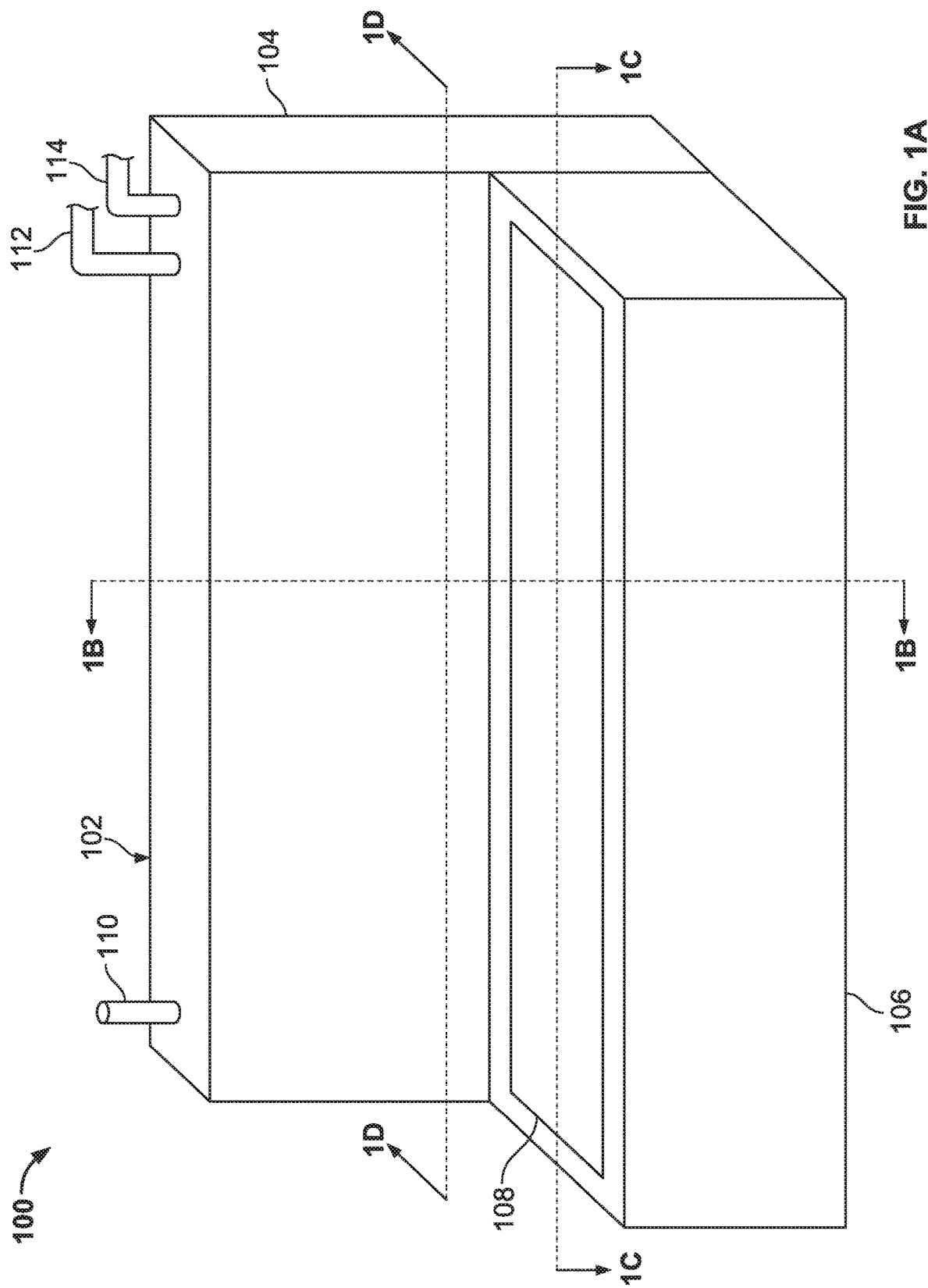
FIGS. 1A-1D illustrate various schematic views of an example implementation of a data center cooling system that uses a non-conductive liquid coolant and an immersion cooling system thermally coupled to one or more electronic heat-generating devices.
Figure 1B:
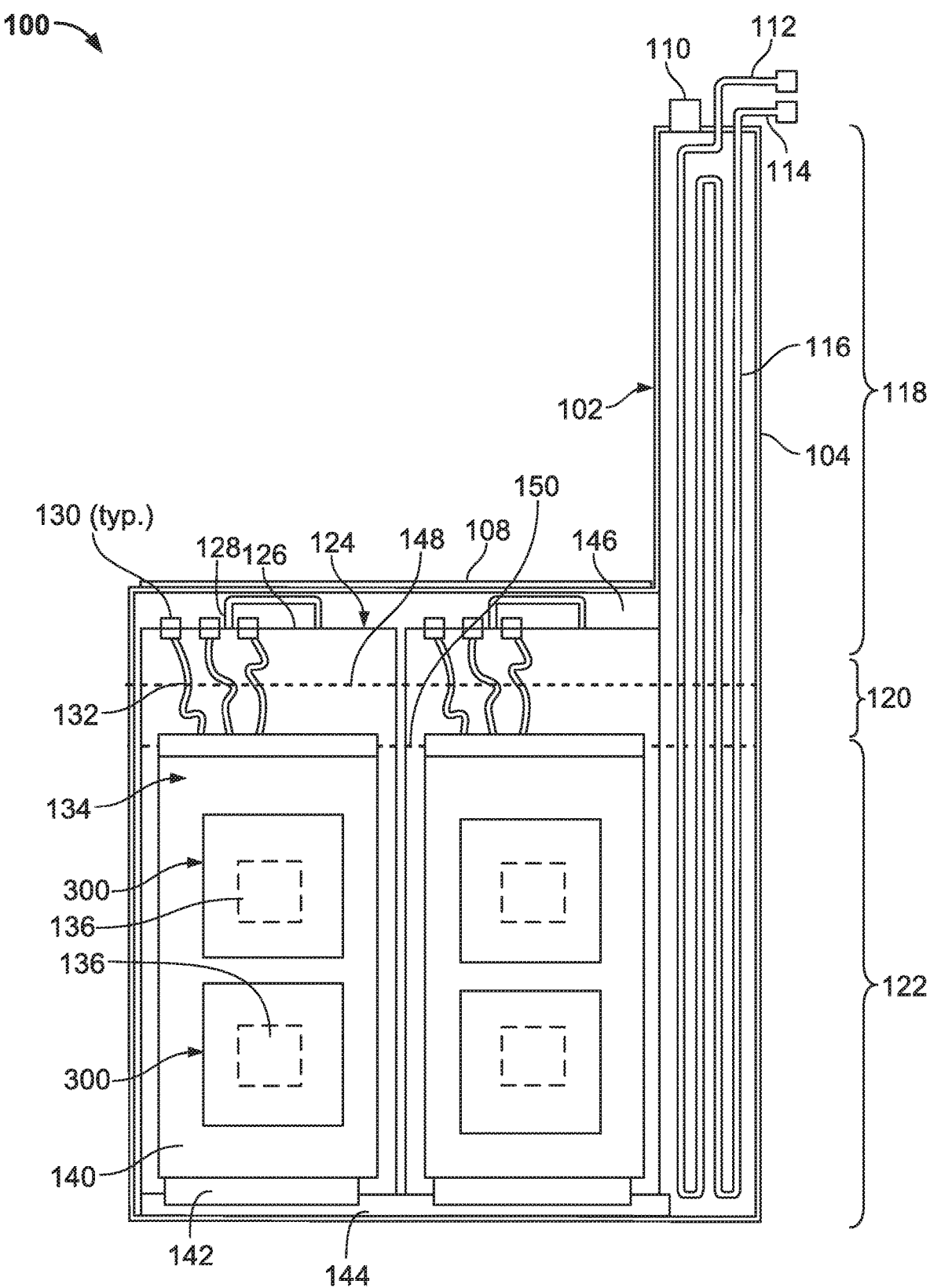
Figure 1C:
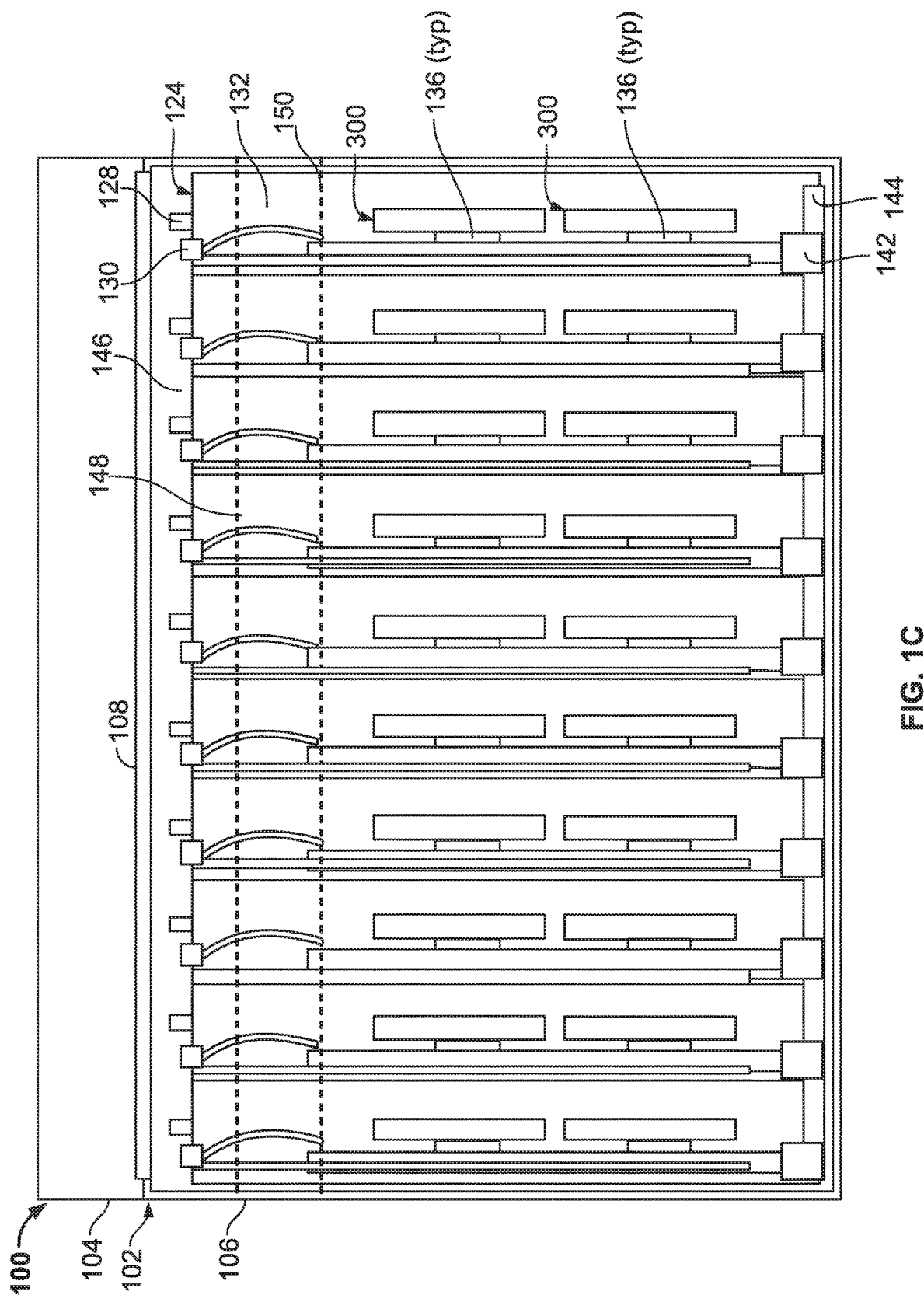
Figure 1D:
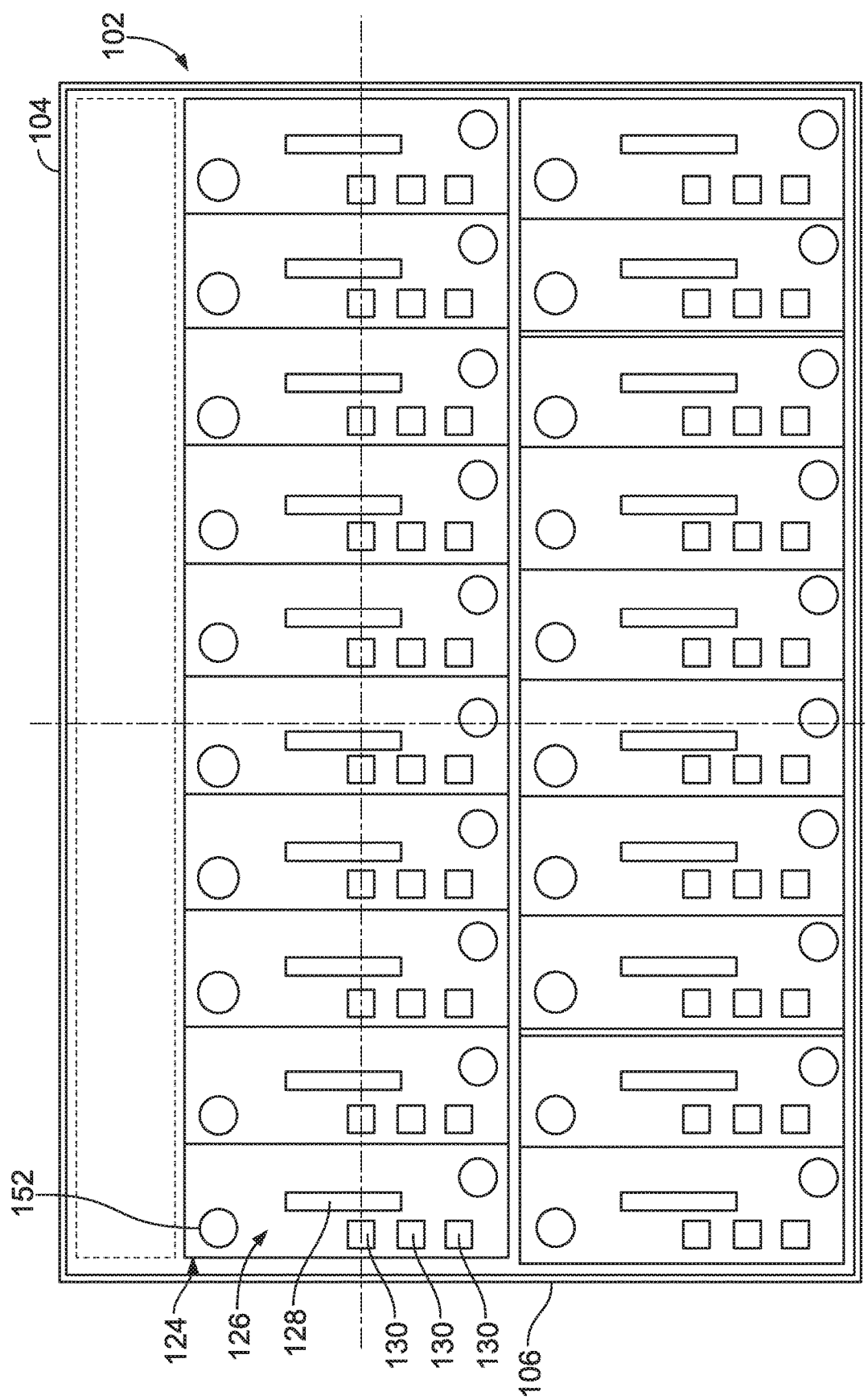

FIGS. 1A-1D illustrate various schematic views of an example implementation of a data center cooling system 100 that uses a non-conductive liquid coolant and an immersion cooling system to cool one or more electronic heat-generating devices. FIG. 1B illustrates a sectional side view of the data center cooling system 100. FIG. 1C illustrates a sectional front view of the data center cooling system 100. FIG. 1D illustrates a sectional top view of the data center cooling system 100. Generally, the system 100 includes an outer container 102 that seals the non-conductive coolant (e.g., liquid and vapor) within the outer container 102. In the illustrated implementation, the outer container 102 comprises a base housing 106 and a chimney housing (or chimney) 104 that extends vertically from the base housing 106. In some implementations, the cooling system 100 can be approximately 50 inches wide (e.g., across the front of the base housing 106), 30 inches deep, and 72 inches tall (e.g., 36 inch height of base housing 106 plus 36 inch extended height of chimney 104 above the base housing 106).

In the illustrated implementation, access to a volume of the outer container 102 is facilitated by a removable cover 108 that includes or create a fluid seal between the volume and an ambient environment external to the outer container 102. The cover 108 may provide access to one or more server assemblies 134 (described below) as well as a liquid phase 150 of a non-conductive coolant, as well as other components of the system 100. The cover 108 may, in some implementations, substantially prevent any or all liquid or vapor non-conductive coolant from exiting the outer container through the base housing 106.

As shown, a relief device 110 may be positioned on the outer container 102, such as at a high point of the container 102 on top of the chimney 104. The relief device 110 may be a vent, orifice, pressure relief valve, or otherwise that allows a flow of air from the volume of the outer container 102 to the ambient environment external to the container 102. For example, as a pressure relief valve, the device may be preset to open at a particular pressure (e.g., internal to the container 102) to vent a build-up of air in the container 102. The air may be vented, for example, so that thermodynamic properties or processes within the container (e.g., cooling, condensing, or otherwise) are not substantially altered from a desired design. In some aspects, as described below, only air or substantially air, rather than a mix of air and a vapor phase 148 of the non-conductive coolant, may be vented to the ambient environment.

As illustrated, a cooling liquid supply 112 and a cooling liquid return 114 may be fluidly coupled to the system 100, e.g., through the outer container 102 and to a cooling module 116 mounted within the volume of the container 102. The cooling liquid supply 112 may be, for example, a chilled water supply, chilled glycol/refrigerant supply, an evaporatively-cooled liquid, or otherwise (e.g., a liquid coolant that is cooled through mechanical refrigeration, evaporation, or otherwise).

With references to FIGS. 1B-1D, one or more inner containers 124 are mounted within the volume of the outer container 102. Each of the illustrated inner containers 124 seal the liquid phase 150 and the vapor phase 148 of the non-conductive coolant within a volume of the inner container 124 that is in fluid communication, as shown, with the chimney 104. A top portion of the inner container 124 may be formed by a cover 126 that includes, in this implementation, a handle 128. The cover 126 may form part of the server assembly 134. In alternative embodiments, the cover 126 may be separated from the server assembly 134. In any event, the outer container 102 and inner container 124 (or containers 124) may form a container-in-container system that substantially seals the liquid phase 150 and the vapor phase 148 of the non-conductive coolant within the inner container 124 and chimney 104.

The illustrated server assembly 134, as shown, may be vertically positioned within the inner container 124 and, in this implementation, immersed within the liquid phase 150 of the non-conductive coolant in a sub-cooled liquid layer 122. The server assembly 134, in this example, includes one or more memory modules 138 (e.g., DIMMs or other memory modules), one or more processors 136 (e.g., CPUs or otherwise), and a power interconnect 142. In this example, these components may be mounted on a server board 140 which is mounted to a backing plate 144.

The server assembly also includes one or more I/O patch panels 130 that are mounted above or to the cover 126 and connected to the memory modules 138 and/or processors 136 through connectors 132. As shown, the I/O patch panels 130 are positioned above the vapor phase 148 of the non-conductive coolant within a vapor condensing layer 120 and in an air/vapor mixture 146. The air/vapor mixture 146 may include a mix of air and the vapor phase 146 of the non-conductive coolant. In some embodiments, the mixture 146 may be substantially or mostly (or all) air.

Further, in this example, and as discussed in more detail below with respect to FIG. 3, one or more immersion cooling systems 300 are mounted to, e.g., the processors 136 of the server assembly 134. Each immersion cooling system 300 is in conductive thermal contact with the one or more processors 136 to receive heat to the system 300 from the one or more processors 136. Alternatively or additionally, the immersion cooling system 300 is in conductive thermal contact with the one or more memory modules or other heat generating devices to receive heat to the system 300 from the one or more memory modules or other heat generating devices. Each immersion cooling system 300 includes a working fluid that phase changes from a liquid to a vapor (or mixed-phase fluid) upon receipt of the heat from the heat generating devices of the server assembly 134. The vapor (or mixed-phase fluid) condenses in one or more heat transfer devices (e.g., heat pipes, condenser tubes) of the immersion cooling system 300 upon release of the heat to the liquid phase 150 of the non-conductive coolant (in which the immersion cooling system 300 and server assembly 134 are immersed). In some aspects, release of the heat of the immersion cooling system 300 into the liquid phase 150 of the non-conductive coolant causes vaporization of the liquid phase 150 to the vapor phase 148 of the non-conductive coolant.

In some aspects, this combination of heat transfer steps may more efficiently remove heat from the heat generating devices on the server assembly 134. For example, a first heat transfer step may include conductive heat transfer from the heat generating device(s) to the immersion cooling system 300 (e.g., a vapor chamber or housing of the system 300). A second heat transfer step may include one or both of conductive and convective heat transfer from the vapor chamber or housing of the system 300 to the liquid working fluid inside the system 300. A third heat transfer step may include vaporization of the liquid working fluid inside the system 300 to vapor working fluid inside the system 300. A fourth heat transfer step may include one or both of conductive and convective heat transfer from one or more heat transfer devices of the system 300 to the liquid phase 150. A fifth heat transfer step may include vaporization of the liquid phase 150 to the vapor phase 148 of the non-conductive liquid.

As illustrated in this implementation, a cooling module 116 is mounted within the chimney 104. Although the cooling module 116 shown here is a cooling coil (e.g., fin-and-tube heat exchanger), other forms of cooling modules, such as thermoelectric coolers, Peltier coolers, or otherwise, also are within the scope of the present disclosure. In this example, the cooling module 116 extends through all or most of the height of the chimney 104 (and can also extend a width of the chimney 104 as well). As illustrated, the cooling module 116 extends through several thermodynamic layers within the chimney 104 and the volume of the outer container 102 generally. At the bottom of the chimney 104, the cooling module 116 is positioned in the sub-cooled liquid layer 122, which contains all or mostly the liquid phase 150 of the non-conductive coolant.

Here, the cooling module 116 can sub-cool the liquid phase 150, in which the server assemblies 134 are immersed to cool the components of the assemblies 134. Towards the middle of the chimney 104, the cooling module 116 extends through the vapor condensing layer 120, which contains all or mostly the vapor phase 148 of the non-conductive coolant. Here, the cooling module 116 cools, and thereby condenses, the vapor phase 146 to the liquid phase 150. Towards the top of the chimney 104, the cooling module 116 extends through a coolant recovery layer 118, which contains mostly or all air, but could also contain some of the vapor phase 148 of the non-conductive coolant. Here, the cooling module 116 cools the air to condense all or most of any remaining vapor phase 148 of the non-conductive coolant. Thus, at or near the pressure relief device 110, all or mostly air (and not costly non-conductive coolant) is vented to the ambient environment.

With reference to FIG. 1D specifically, each cover 126 includes one or more vent holes 152 that fluidly couple the volume of the inner containers 124 with the volume of the outer container 102 in the base housing 106. For example, the vent holes 152 allow for gaseous communication from the air/vapor mixture 146 in the coolant recovery layer 118 to exit the volume of the inner containers 124 to the volume of the outer container 102, including the coolant recovery layer 118 in the chimney 104.

Figure 2:
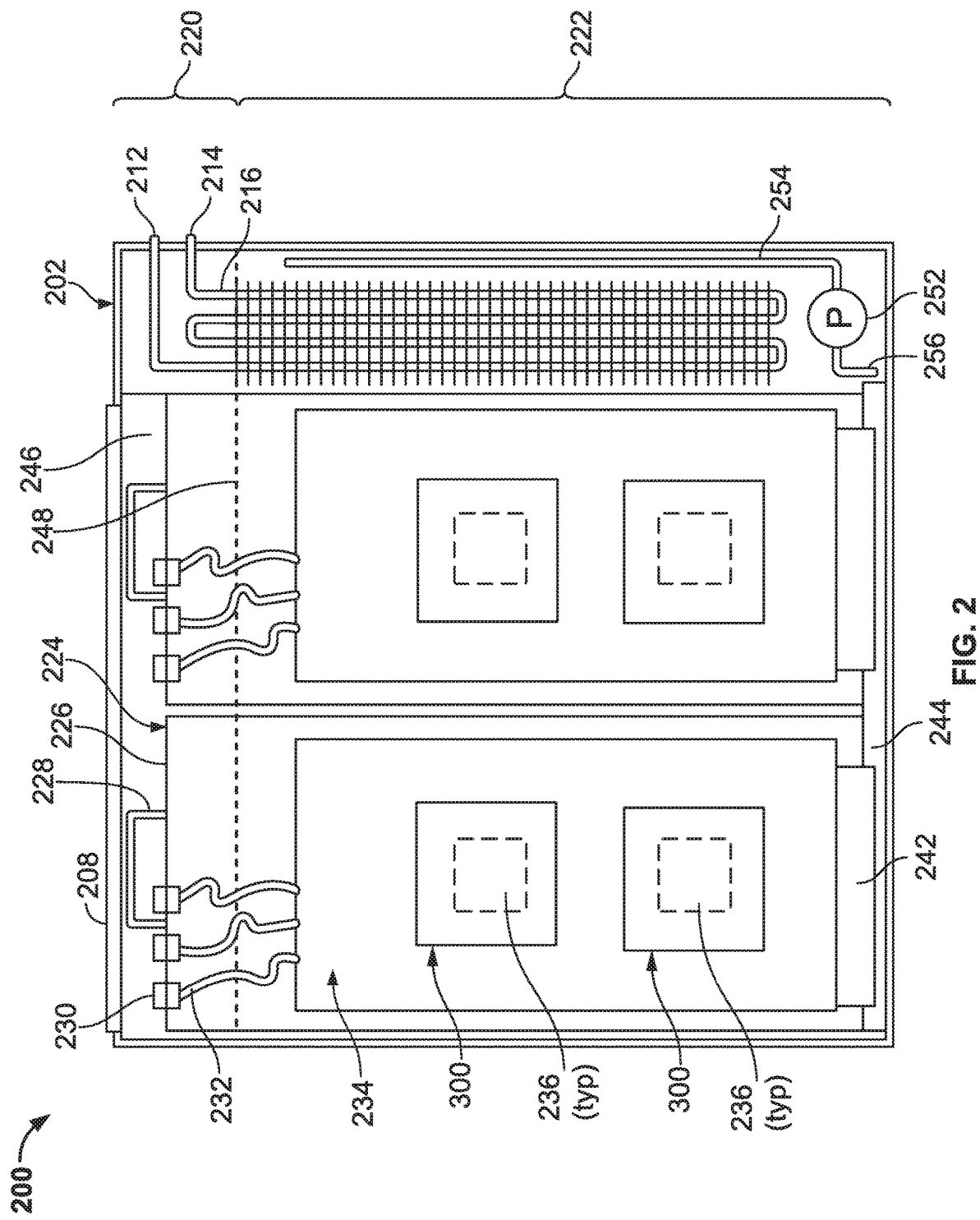
FIG. 2 illustrates a schematic side view of another example implementation of a data center cooling system that uses a non-conductive liquid coolant and an immersion cooling system thermally coupled to one or more electronic heat-generating devices.

FIG. 2 illustrates a schematic side view of another example implementation of a data center cooling system 200 that uses a non-conductive liquid coolant. In this example implementation, the data center cooling system 200 may utilize a single-phase (e.g., liquid phase) non-conductive coolant, e.g., a non-conductive coolant that does not vaporize to a vapor phase from a liquid phase based on receiving a heat load from one or more electric heat-generating devices on a server assembly. Some examples of single-phase non-conductive coolant include mineral oil, fluorocarbons, and other non-conductive coolants that have a flash, or boiling, point less than a temperature (e.g., maximum rated temperature) of the electronic heat-generating devices.

In this example implementation, the system 200 includes an outer container 202 that seals the non-conductive coolant (e.g., liquid) within the outer container 202. In the illustrated implementation, the outer container 202 comprises a substantially rectangular prismatic volume (e.g., without a chimney). In some implementations, the cooling system 200 can be approximately 50 inches wide (e.g., across the front of the container 202, not shown in FIG. 2), 30 inches deep, and 36 inches tall.

In the illustrated implementation, access to a volume of the outer container 202 is facilitated by a removable cover 208 that includes or create a fluid seal between the volume and an ambient environment external to the outer container 202. The cover 208 may provide access to one or more server assemblies 234 (described below) as well as the liquid non-conductive coolant 248, as well as other components of the system 200. The cover 208 may, in some implementations, substantially prevent any or all liquid or vapor non-conductive coolant from exiting the outer container through the container 202.

As illustrated, a cooling liquid supply 212 and a cooling liquid return 214 may be fluidly coupled to the system 200, e.g., through the outer container 202 and to a cooling module 216 mounted within the volume of the container 202. The cooling liquid supply 212 may be, for example, a chilled water supply, chilled glycol/refrigerant supply, an evaporatively-cooled liquid, or otherwise. (e.g., a liquid coolant that is cooled through mechanical refrigeration, evaporation, or otherwise).

One or more inner containers 224 are mounted within the volume of the outer container 202. Each of the illustrated inner containers 224 seal the liquid non-conductive coolant 248 within a volume of the inner container 224. A top portion of the inner container 224 may be formed by a cover 226 that includes, in this implementation, a handle 228.

The illustrated server assembly 234, as shown, may be vertically positioned within the inner container 224 and, in this implementation, immersed within the liquid non-conductive coolant 248 in a liquid layer 222. The server assembly 234, in this example, includes one or more memory modules 238 (e.g., DIMMs or other memory modules), one or more processors 236 (e.g., CPUs or otherwise), and a power interconnect 242. In this example, these components may be mounted on a server board which is mounted to a backing plate 244.

The server assembly also includes one or more I/O patch panels 230 that are mounted above or to the cover 226 and connected to the memory modules 238 and/or processors 236 through connectors 232. As shown, the I/O patch panels 230 are positioned above the liquid non-conductive coolant 248 and within an air layer 246 that contains mostly or only air.

Further, in this example, and as discussed in more detail below with respect to FIG. 3, one or more immersion cooling systems 300 are mounted to, e.g., the processors 236 of the server assembly 234. Each immersion cooling system 300 is in conductive thermal contact with the one or more processors 236 to receive heat to the system 300 from the one or more processors 236. Alternatively or additionally, the immersion cooling system 300 is in conductive thermal contact with the one or more memory modules or other heat generating devices to receive heat to the system 300 from the one or more memory modules or other heat generating devices. Each immersion cooling system 300 includes a working fluid that phase changes from a liquid to a vapor (or mixed-phase fluid) upon receipt of the heat from the heat generating devices of the server assembly 234. The vapor (or mixed-phase fluid) condenses in one or more heat transfer devices (e.g., heat pipes, condenser tubes) of the immersion cooling system 300 upon release of the heat to the liquid phase 222 of the non-conductive coolant (in which the immersion cooling system 300 and server assembly 234 are immersed). In some aspects, release of the heat of the immersion cooling system 300 into the liquid phase 222 of the non-conductive coolant causes vaporization of the liquid phase 222 to the vapor phase 220 of the non-conductive coolant.

In some aspects, this combination of heat transfer steps may more efficiently remove heat from the heat generating devices on the server assembly 234. For example, a first heat transfer step may include conductive heat transfer from the heat generating device(s) to the immersion cooling system 300 (e.g., a vapor chamber or housing of the system 300). A second heat transfer step may include one or both of conductive and convective heat transfer from the vapor chamber or housing of the system 300 to the liquid working fluid inside the system 300. A third heat transfer step may include vaporization of the liquid working fluid inside the system 300 to vapor working fluid inside the system 300. A fourth heat transfer step may include one or both of conductive and convective heat transfer from one or more heat transfer devices of the system 300 to the liquid phase 222 of the non-conductive liquid 248.

As illustrated in this implementation, a cooling module 216 is mounted within the volume of the container 202. Although the cooling module 216 shown here is a cooling coil (e.g., fin-and-tube heat exchanger), other forms of cooling modules, such as thermoelectric coolers, Peltier coolers, or otherwise, also are within the scope of the present disclosure. In this example, the cooling module 216 extends through all or most of the height of the container 202 (and can also extend a width of the outer container 202 as well). As illustrated, the cooling module 216 extends through several thermodynamic layers within the outer container 202 and the volume of the outer container 202, generally. At the bottom of the outer container 202, the cooling module 216 is positioned in the liquid layer 222, which contains all or mostly the liquid non-conductive coolant 248. Here, the cooling module 216 can cool or sub-cool the liquid non-conductive coolant 248, in which the server assemblies 234 are immersed, to cool the components of the assemblies 234. At or near a top of the outer container 202, the cooling module 216 can extend through the air layer 220, but the heat exchanger portion of the cooling module 216 may reside all or mostly in the liquid layer 222.

A pump 252, as shown, includes an inlet 256 in a bottom portion of the liquid layer 222 and an outlet coupled to a header 254, which in turn includes an outlet near or adjacent a top end of the cooling module 216. The pump 252 may circulate (e.g., constantly, variably, periodically, or otherwise) the liquid non-conductive coolant 248 within the volume of the outer container 202 (e.g., from bottom to top) to, e.g., ensure even cooling of the liquid non-conductive coolant 248 by the cooling module 216 (so as to remove the heat transferred from the server assemblies 234 to the liquid phase 222 of the non-conductive coolant 248), and ensure cooling of the server assemblies 234 through thermally conductive and/or convective contact. Upon such thermally conductive and/or convective contact, the liquid phase 222 of the non-conductive coolant 248 may cool the heat-generating components without boiling or vaporizing.

In some example implementations, a pressure relief device (not shown) may be mounted to a top of the outer container 202. The relief device may be a vent, orifice, pressure relief valve, or otherwise that allows a flow of air from the volume of the outer container 202 to the ambient environment external to the container 202. For example, as a pressure relief valve, the device may be preset to open at a particular pressure (e.g., internal to the container 202) to vent a build-up of air in the container 202. The air may be vented, for example, so that thermodynamic properties or processes within the container (e.g., cooling or otherwise) are not substantially altered from a desired design.

Each cover 226 may also include one or more vent holes (not shown) that fluidly couple the volume of the inner containers 224 with the volume of the outer container 202. For example, the vent holes allow for gaseous communication from the air layer 220 to exit the volume of the inner containers 224 to the volume of the outer container 204.

Figure 3:
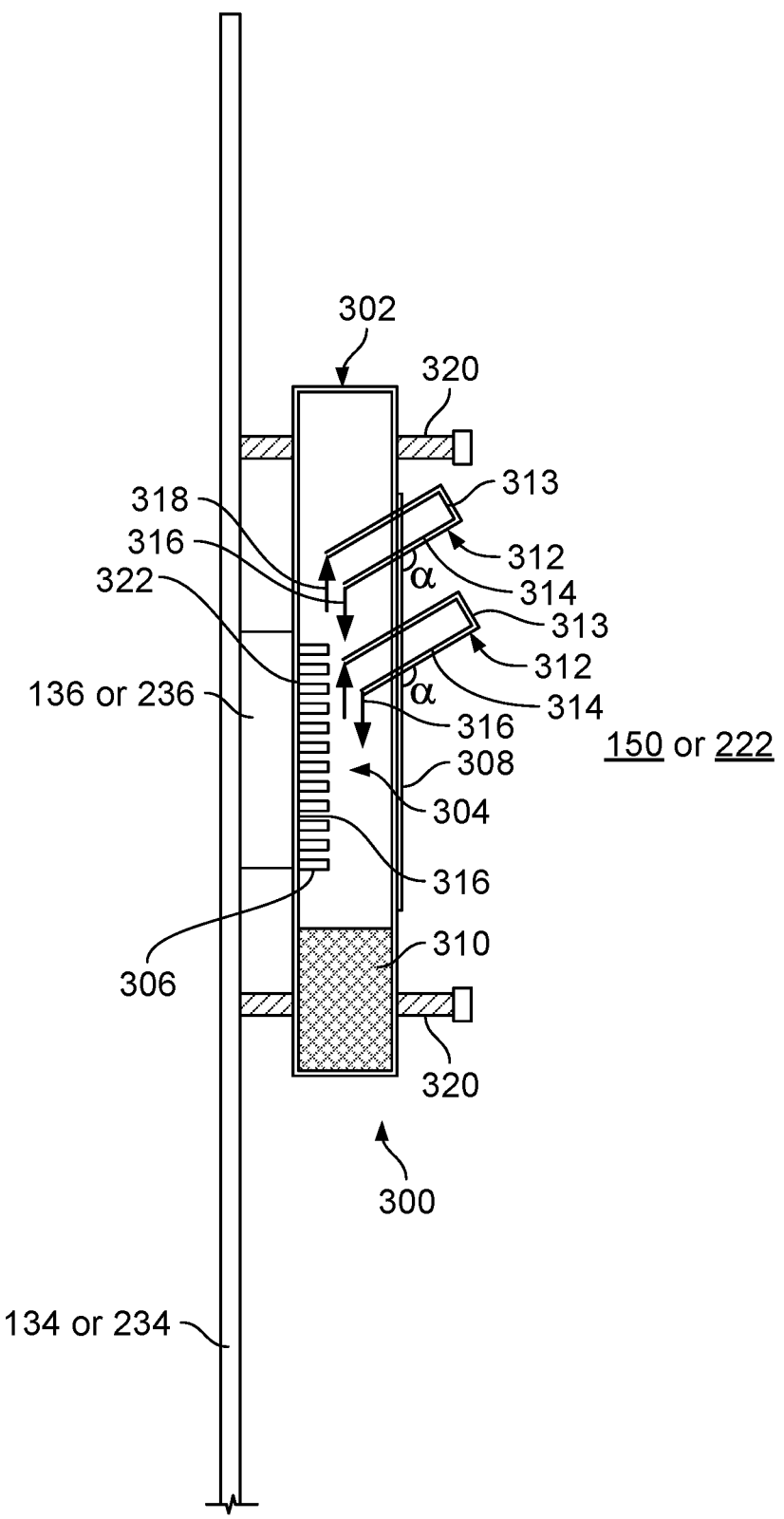
FIG. 3 illustrates an example implementation of an immersion cooling system thermally coupled to one or more electronic heat-generating devices.

FIG. 3 illustrates an example implementation of the immersion cooling system 300 that is thermally coupled to one or more electronic heat-generating devices (e.g., processor 136 or processor 236 in this example). For example, as shown in FIG. 3, a vapor chamber 302 of the immersion cooling system 300 is in conductive thermal contact with the heat generating device 136 (or 236). The heat generating device 136 (or 236), as shown, is mounted on the server assembly 134 (or 234). In this example, a thermal interface material 322 (e.g., phase change material) is positioned between the vapor chamber 302 and the heat generating device 136 (or 236) and in thermal conductive contact with both to ensure a good thermal interfacial contact.

In this example implementation, the vapor chamber 302 defines an inner volume 304 in which a working fluid is enclosed. A liquid working fluid 316 is shown pooled at a bottom portion of the inner volume 304 and on top of a filler 310. The filler 310, in this example, is a solid material that fills up a bottom portion of the inner volume 304. In some aspects, the filler 310 that is inserted into the bottom portion of the inner volume 304 ensures that a top surface of the pool of the liquid working fluid 316 is at a level at or near a position of the heat generating device 136 (or 236).

As illustrated, one or more heat transfer surfaces 306 (e.g., fins, ridges, undulations) are mounted to the vapor chamber 302 within the inner volume 304. In this example, the heat transfer surfaces 306 are mounted to an inner wall of the vapor chamber 302 adjacent the heat generating device 136 (or 236), thereby increasing a rate of heat transfer from the heat generating device 136 (or 236) and the liquid working fluid 316. In some aspects, a volume of the liquid working fluid 316 is pre-determined so that the top surface covers some or all of the heat transfer surfaces 306 during normal operation of the immersion cooling system 300.

One or more biasing members 320 are positioned to hold the immersion cooling system 300 (e.g., the vapor chamber 302) in thermal conductive contact with the heat generating device 136 (or 236). In this example, the biasing members 320 are one or more springs, such as coil springs or Bellville washers, which, e.g., are coupled with a fastener that attaches the vapor chamber 302 to the serer assembly 134 (or 234). The springs provide a force that urges (e.g., constantly) the vapor chamber 302 toward the server assembly 134 (or 234) and against the heat generating device 136 (or 236).

As shown in this example, a heat transfer enhancement surface 308 is formed on all or part of an external surface of the vapor chamber 302. In this example, the heat transfer enhancement surface 308 is formed on an external surface of the vapor chamber 302 that is in full or almost full immersive contact with the liquid phase 150 (or liquid layer 222) of the non-conductive liquid in which the immersion cooling system 300 and server assembly 134 (or 234) is immersed. In some aspects, the heat transfer enhancement 308 may include or comprise fins, ridges, undulations, or other surface etchings that promote heat transfer between the vapor chamber 302 and the liquid non-conductive fluid.

As shown in FIG. 3, the example immersion cooling system 300 includes one or more heat transfer devices 312 that are positioned in part in the inner volume 304 and extend through the vapor chamber 302 into the non-conductive liquid (150 or 222). Generally, the heat transfer devices 312 operate to receive a vapor phase 318 of the working fluid in the vapor chamber 302 and facilitate transfer of heat from the vapor phase 318 to the non-conductive coolant, thereby condensing the vapor phase 318 to the liquid phase 316 of the working fluid.

In this example, the heat transfer device 312 comprises a condenser tube that includes a flowpath 313 for the vapor phase 318 to enter (within the inner volume 304 of the vapor chamber 302) and flow around (in a U shape as shown) and condense in the flowpath 313 as heat is transferred to the non-conductive liquid (150 or 222) external to the vapor chamber 304 prior to exiting the flowpath 313 as the liquid phase 316. In some aspects, as shown, a wicking structure ("wick") 314 may be inserted into the flowpath 313 to help the vapor phase 318 flow therethrough.

In alternative implementations, the heat transfer device 312 comprises a heat pipe that encloses a working fluid that, for example, vaporizes into a vapor phase in a portion of the heat pipe within the inner volume 304 and condenses into a liquid phase in a portion of the heat pipe external to the inner volume 304 (e.g., within the non-conductive liquid). Thus, in some aspects, there may be a first working fluid enclosed within the inner volume 304 of the vapor chamber 302 as well as a second working fluid enclosed within one or more heat pipes.

As shown in FIG. 3, the heat transfer devices 312 are positioned at an angle, α, relative to an orientation of the vapor chamber 304, the heat generating device 136 (or 236), and the server tray 134 (or 234). As shown, the angle, α, is measured from a portion of the heat transfer device 312 to a surface of the vapor chamber 302 that is adjacent the non-conductive liquid 150 (or 222). The angle, α, is adjustable depending on the design of the immersion cooling system 300. The design of the immersion cooling system 300 may depend on, for example, an amount of space available for the server tray assemblies, how close the server tray assemblies are packed within the container, and other factors. For example, the angle, α, may be close to 90 degrees, less than 90 degrees, or greater than 90 degrees.

In an example operation of either one of systems 100 or 200, the heat generating devices 136 (or 236) (e.g., a hardware processor) is operated during data center operations and generates heat. The generated heat conductively transfers to a vapor chamber 302 of an immersion cooling system 300 that is mounted to (and in conductive thermal contact with) the device 136 (or 236). In some aspects, the generated heat transfers through a thermal interface material, such as a phase change material, that is positioned between the device 136 (or 236) and the vapor chamber 302 (e.g., to increase a rate of heat transfer to the vapor chamber 302).

The heat transferred to the vapor chamber 302 vaporizes at least a portion of a liquid working fluid enclosed within the immersion cooling system 300. In some aspects, heat transfer surfaces mounted or formed on one or more inner surfaces of the vapor chamber 302 increase a rate of vaporization (e.g., compared to a rate with no such heat transfer surfaces) of the liquid working fluid. In some aspects, as the vapor chamber 302 is oriented vertically with respect to gravity, the vaporized working fluid naturally circulates toward a top portion of the vapor chamber 302.

As the vaporized working fluid in the vapor chamber 302 rises, it circulates into one or more condenser tubes 312 that extend from the vapor chamber 302 and into a non-conductive coolant liquid that immerses the server tray assembly 134 (or 234) onto which the devices 136 (or 236) are mounted (e.g., on a motherboard of the assembly). As the vapor circulates in the condenser tubes 312, heat from the vaporized working fluid transfers into the non-conductive coolant liquid. Based on this heat transfer, the vaporized working fluid condenses in the condenser tubes 312 and returns (in liquid phase) into the inner volume of the vapor chamber 302, where the operation repeats.

A number of embodiments have been described. Nevertheless, it will be understood that various modifications may be made without departing from the spirit and scope of what is described. For example, the steps of the exemplary operations may be performed in other orders, some steps may be removed, and other steps may be added. As another example, data center cooling systems that utilize a container-in-container concept as described herein may not use a chimney as part of an outer container, but instead use a substantially rectangular (or square) prismatic volume. Further, some implementations that use a single container (e.g., only an outside container) may or may not utilize a chimney. As another example, a data center cooling system that uses a single-phase non-conductive coolant according to the present disclosure may use a container-in-container approach or a single container approach, with or without a chimney as described herein. Accordingly, other embodiments are within the scope of the following claims.

What is claimed is:

1. A data center cooling system, comprising:
an outer container that defines a first volume;
an inner container that defines a second volume and is positioned within the first volume, the inner container comprising an air outlet that comprises an airflow path between the first and second volumes;
a liquid seal to fluidly isolate a liquid phase of a non-conductive coolant that fills at least a portion of the first and second volumes from an ambient environment;
at least one server tray assembly comprising:
a plurality of electronic heat-generating devices immersed in the liquid phase of the non-conductive coolant; and
an immersion cooling system mounted to and in conductive thermal contact with one or more of the plurality of electronic heat-generating devices, the immersion cooling system comprising: a working fluid in thermal communication with the one or more electronic heat-generating devices and the non-conductive coolant, a vapor chamber mounted to and in conductive thermal contact with the one or more electronic heat-generating devices, and one or more heat transfer devices positioned in thermal contact with the working fluid within an inner volume of the vapor chamber and in thermal contact with a liquid phase of the non-conductive coolant.

2. The data cooling system of claim 1, wherein each of the one or more heat transfer devices comprises a condenser tube, the condenser tube comprising:
an inlet open to the inner volume to receive a vapor phase of the working fluid from the inner volume;
an outlet open to the inner volume to circulate a liquid phase of the working fluid to the inner volume; and
a u-shaped flowpath between the inlet and the outlet that extends from the inner volume, through a wall of the vapor chamber, and to the second volume.

3. The data cooling system of claim 2, further comprising a wick positioned in at least a portion of the u-shaped flowpath.

4. The data cooling system of claim 1, wherein each of the one or more heat transfer devices comprises a heat pipe positioned to extend from the inner volume, through a wall of the vapor chamber, and into the second volume.

5. The data cooling system of claim 1, wherein the immersion cooling system further comprises a thermal interface material positioned between and in conductive thermal contact with the one or more electronic heat-generating devices and the vapor chamber.

6. The data cooling system of claim 1, wherein the immersion cooling system further comprises one or more biasing members coupled to the vapor chamber and the server tray assembly and configured to urge the vapor chamber toward the one or more electronic heat-generating devices.

7. The data center cooling system of claim 1, wherein the outer container comprises:
a pressure relief valve configured to vent a portion of air, vented from the second volume through the air outlet and into the first volume, to the ambient environment; and
a base and a chimney that extends vertically from the base, the base comprising a first portion of the first volume and the chimney comprises a second portion of the first volume that is in fluid communication with the first portion.

8. The data center cooling system of claim 7, wherein the second portion defines a coolant recovery layer that comprises a mixture of air and a vapor phase of the non-conductive coolant, a vapor condensing layer that comprises substantially the vapor phase of the non-conductive coolant, and a liquid sub-cooling layer that comprises substantially the liquid phase of the non-conductive coolant.

9. The data center cooling system of claim 7, further comprising a cooling module mounted in the chimney and configured to cool the non-conductive coolant.

10. The data center cooling system of claim 1, wherein the non-conductive coolant comprises a dielectric coolant.

11. A method for cooling a plurality of electronic heat-generating devices in a data center comprising:
enclosing a plurality of server tray assemblies in a volume defined by a first container, each of the server tray assemblies comprising:
the plurality of electronic heat-generating devices, and
an immersion cooling system mounted to and in conductive thermal contact with one or more of the plurality of electronic heat-generating devices, the immersion cooling system comprising a working fluid in thermal communication with the one or more electronic heat-generating devices;
immersing the plurality of server tray assemblies in a liquid phase of a non-conductive coolant;
operating the one or more electronic heat-generating devices to generate heat;
transferring the generated heat from the one or more electronic heat-generating devices to the working fluid of the immersion cooling system;
transferring the generated heat to the working fluid contained in an inner volume of a vapor chamber of the immersion cooling system that is mounted to and in conductive thermal contact with the one or more electronic heat-generating devices;
vaporizing, with the transferred heat, at least a portion of a liquid phase of the working fluid into a vapor phase of the working fluid;
circulating the vapor phase from the inner volume into one or more condenser tubes positioned in thermal contact with the working fluid within an inner volume of the vapor chamber and in thermal contact with the liquid phase of the non-conductive coolant; and
transferring the generated heat from the working fluid of the immersion cooling system to the liquid phase of the non-conductive coolant.

12. The method of claim 11, wherein circulating the vapor phase from the inner volume into the one or more condenser tubes comprises:
circulating the vapor phase through an inlet of a particular condenser tube that is open to the inner volume;
circulating the vapor phase through a u-shaped flowpath of the particular condenser tube;
condensing at least a portion of the vapor phase in the u-shaped flowpath by transferring heat to the liquid phase of the non-conductive coolant; and
circulating the condensed portion through an outlet of the particular condenser tube and into the inner volume.

13. The method of claim 12, wherein circulating the vapor phase through the u-shaped flowpath comprises circulating the vapor phase based at least partially on wicking the vapor phase through the u-shaped flowpath.

14. The method of claim 11, further comprising:
vaporizing, with heat in the vapor phase of the working fluid, at least a portion of a liquid phase of a refrigerant contained in at least one heat pipe positioned in thermal contact with the working fluid within an inner volume of the vapor chamber and in thermal contact with the liquid phase of the non-conductive coolant; and
transferring heat from the vaporized refrigerant to the liquid phase of the non-conductive coolant.

15. The method of claim 11, further comprising transferring the heat from the one or more electronic heat-generating devices through a thermal interface material positioned between and in conductive thermal contact with the one or more electronic heat-generating devices and the vapor chamber.

16. The method of claim 11, further comprising urging the vapor chamber toward the one or more electronic heat-generating devices with one or more biasing members coupled to the vapor chamber and the server tray assembly.

17. The method of claim 11, further comprising:
enclosing the first container in a second volume of a second container, the non-conductive coolant filling at least a portion of the first and second volumes;
sealing the liquid phase of the non-conductive coolant from an ambient environment;
transferring a heat load from the plurality of electronic heat-generating devices to the liquid phase of the non-conductive coolant;
forming an airflow path between the first and second volumes; and
venting a portion of air from the first volume, through the airflow path, through the second volume and to the ambient environment.

18. The method of claim 17, wherein the second container comprises a base and a chimney that extends vertically from the base, the base comprising a first portion of the second volume and the chimney comprises a second portion of the second volume that is in fluid communication with the first portion.

19. The method of claim 18, further comprising:
cooling a mix of air and a first portion of a vapor phase of the non-conductive coolant in a top portion of the chimney to condense the first portion of the vapor phase to the liquid phase of the non-conductive coolant;
cooling a second portion of the vapor phase of the non-conductive coolant in a middle portion of the chimney to condense the second portion of the vapor phase to the liquid phase of the non-conductive coolant; and
sub-cooling the liquid phase of the non-conductive coolant in a bottom portion of the chimney.

20. The method of claim 18, further comprising supplying a cooling fluid to a cooling module positioned in the chimney.

21. The method of claim 17, wherein the non-conductive coolant comprises a single-phase non-conductive coolant, the method further comprising:
circulating a sub-cooled liquid phase of the non-conductive liquid coolant from a bottom portion of the second volume to a top portion of the second volume; and
circulating the sub-cooled liquid in the top portion over a cooling module positioned in the second volume.

22. The method of claim 17, wherein the second container comprises a human-occupiable housing, and the second volume comprises a human-occupiable workspace.

23. The method of claim 11, wherein the non-conductive coolant comprises a dielectric coolant.

24. A submergible server tray assembly, comprising:
a motherboard;
at least one processor coupled to the motherboard; and
an immersion cooling system mounted to and in conductive thermal contact with the processor, the immersion cooling system comprising a working fluid in thermal communication with the processor, where the motherboard, processor, and immersion cooling system are configured to submerge in a dielectric cooling liquid, the immersion cooling system further comprising:
a housing mounted to and in conductive thermal contact with the processor; and
one or more condenser tubes positioned in thermal contact with the working fluid within an inner volume of the housing and extending from the housing, where each of the one or more condenser tubes is configured to submerge in the dielectric cooling liquid, and each condenser tube comprises:
an inlet open to the inner volume;
an outlet open to the inner volume; and
a conduit between the inlet and the outlet that extends from the inner volume, through a wall of the housing, and external to the housing.

25. The server tray assembly of claim 24, further comprising a wick positioned in at least a portion of the conduit.

26. The server tray assembly of claim 24, further comprising a phase change material positioned between and in conductive thermal contact with the processor and the housing.

27. A data center cooling system, comprising:
an outer container that defines a first volume;
an inner container that defines a second volume and is positioned within the first volume, the inner container comprising an air outlet that comprises an airflow path between the first and second volumes;
a liquid seal to fluidly isolate a liquid phase of a non-conductive coolant that fills at least a portion of the first and second volumes from an ambient environment;
at least one server tray assembly comprising:
a plurality of electronic heat-generating devices immersed in the liquid phase of the non-conductive coolant; and
an immersion cooling system mounted to and in conductive thermal contact with one or more of the plurality of electronic heat-generating devices, the immersion cooling system comprising a working fluid in thermal communication with the one or more electronic heat-generating devices and the non-conductive coolant,
wherein the outer container comprises a pressure relief valve configured to vent a portion of air, vented from the second volume through the air outlet and into the first volume, to the ambient environment; a base that comprises a first portion of the first volume; and a chimney that extends vertically from the base and comprises a second portion of the first volume that is in fluid communication with the first portion.

28. The data center cooling system of claim 27, wherein the second portion defines a coolant recovery layer that comprises a mixture of air and a vapor phase of the non-conductive coolant, a vapor condensing layer that comprises substantially the vapor phase of the non-conductive coolant, and a liquid sub-cooling layer that comprises substantially the liquid phase of the non-conductive coolant.

29. The data center cooling system of claim 27, further comprising a cooling module mounted in the chimney and configured to cool the non-conductive coolant.

30. The data center cooling system of claim 27, wherein the non-conductive coolant comprises a dielectric coolant.

31. A method for cooling electronic heat-generating devices in a data center, comprising:
enclosing a plurality of server tray assemblies in a volume defined by a first container, each of the server tray assemblies comprising:
a plurality of electronic heat-generating devices, and
an immersion cooling system mounted to and in conductive thermal contact with one or more of the plurality of electronic heat-generating devices, the immersion cooling system comprising a working fluid in thermal communication with the one or more electronic heat-generating devices;
immersing the plurality of server tray assemblies in a liquid phase of a non-conductive coolant;
enclosing the first container in a second volume of a second container, the non-conductive coolant filling at least a portion of the first and second volumes;
sealing the liquid phase of the non-conductive coolant from an ambient environment;
operating the one or more electronic heat-generating devices to generate a heat load;
transferring the generated heat load from the one or more electronic heat-generating devices to the working fluid of the immersion cooling system;
transferring the generated heat from the working fluid of the immersion cooling system to the liquid phase of the non-conductive coolant;
forming an airflow path between the first and second volumes; and
venting a portion of air from the first volume, through the airflow path, through the second volume and to the ambient environment.

32. The method of claim 31, wherein the second container comprises a base and a chimney that extends vertically from the base, the base comprising a first portion of the second volume and the chimney comprises a second portion of the second volume that is in fluid communication with the first portion.

33. The method of claim 32, further comprising:
cooling a mix of air and a first portion of a vapor phase of the non-conductive coolant in a top portion of the chimney to condense the first portion of the vapor phase to the liquid phase of the non-conductive coolant;
cooling a second portion of the vapor phase of the non-conductive coolant in a middle portion of the chimney to condense the second portion of the vapor phase to the liquid phase of the non-conductive coolant; and
sub-cooling the liquid phase of the non-conductive coolant in a bottom portion of the chimney.

34. The method of claim 32, further comprising supplying a cooling fluid to a cooling module positioned in the chimney.

35. The method of claim 31, wherein the non-conductive coolant comprises a single-phase non-conductive coolant, the method further comprising:
circulating a sub-cooled liquid phase of the non-conductive liquid coolant from a bottom portion of the second volume to a top portion of the second volume; and
circulating the sub-cooled liquid in the top portion over a cooling module positioned in the second volume.

36. The method of claim 31, wherein the second container comprises a human-occupiable housing, and the second volume comprises a human-occupiable workspace.

37. The method of claim 31, wherein the non-conductive coolant comprises a dielectric coolant.

\* \* \* \* \*